(12) United States Patent
Kumazaki et al.

(10) Patent No.: US 8,988,138 B1
(45) Date of Patent: Mar. 24, 2015

(54) SEMICONDUCTOR DEVICE

(71) Applicant: Kabushiki Kaisha Toshiba, Minato-ku (JP)

(72) Inventors: Noriyasu Kumazaki, Kawasaki (JP); Yasufumi Kajiyama, Tokyo (JP); Masaru Koyanagi, Tokyo (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/202,577

(22) Filed: Mar. 10, 2014

Related U.S. Application Data

(60) Provisional application No. 61/874,548, filed on Sep. 6, 2013.

(51) Int. Cl.
G05F 1/10 (2006.01)
G05F 1/46 (2006.01)

(52) U.S. Cl.
CPC .................................. *G05F 1/462* (2013.01)
USPC ........................................................ 327/539

(58) Field of Classification Search
USPC ................... 327/63–71, 77–89, 563
See application file for complete search history.

(56) References Cited

U.S. PATENT DOCUMENTS 7,772,817 B2 * 8/2010 Takagi et al. ................. 323/280

* cited by examiner

*Primary Examiner* — Sibin Chen
(74) *Attorney, Agent, or Firm* — Oblon, McClelland, Maier & Neustadt, L.L.P.

(57) ABSTRACT

A semiconductor device includes an input-part receiving a first voltage and an output-part outputing a second voltage. A current mirror part receives the first voltage. A reference voltage is supplied to a gate of a reference transistor. The reference transistor is electrically connected between the current-mirror part and a ground voltage. A monitor transistor includes a gate electrically connected to the second power-supply voltage, and is electrically connected between the current-mirror part and the ground voltage. A voltage-generation transistor includes a gate electrically connected to both the current-mirror part and the reference transistor. The voltage-generation transistor is electrically connected between the input-part and the output-part. A first capacitor including one end electrically connected to the output-part, and the other end electrically connected to both the current-mirror part and the reference transistor.

12 Claims, 10 Drawing Sheets

SEMICONDUCTOR DEVICE

CROSS REFERENCE TO RELATED APPLICATIONS

This application is based upon and claims the benefit of priority from the prior U.S. provisional Patent Application No. 61/874,548, filed on Sep. 6, 2013, the entire contents of which are incorporated herein by reference.

FIELD

The embodiments of the present invention relate to a semiconductor device.

BACKGROUND

Conventionally, a NAND flash memory has been known as a semiconductor device widely.

DETAILED DESCRIPTION

Embodiments will now be explained with reference to the accompanying drawings. The present invention is not limited to the embodiments.

The semiconductor device according to the present embodiment includes an input-part receiving a first voltage and an output-part outputing a second voltage. A current mirror part receives the first voltage. A reference voltage is supplied to a gate of a reference transistor. The reference transistor is electrically connected between the current-mirror part and a ground voltage. A monitor transistor includes a gate electrically connected to the second power-supply voltage, and is electrically connected between the current-mirror part and the ground voltage. A voltage-generation transistor includes a gate electrically connected to both the current-mirror part and the reference transistor. The voltage-generation transistor is electrically connected between the input-part and the output-part. A first capacitor including one end electrically connected to the output-part, and the other end electrically connected to both the current-mirror part and the reference transistor.

In the following embodiments, the semiconductor device can be applied to an internal power supply voltage of various types of memory. The NAND flash memory is described herein.

Components with substantially the same functionalities and configurations will be referred to with the same reference number and duplicate descriptions will be made only when required. Note that figures are schematic and the relationship between the thickness and the plane dimension of a film and the ratios of the thickness of one layer to another may differ from actual values. Therefore, it should be noted that a specific thickness and dimension should be determined in accordance with the following description. Moreover, it is natural that different figures may contain a component different in dimension and/or ratio.

First Embodiment

Figure 1:
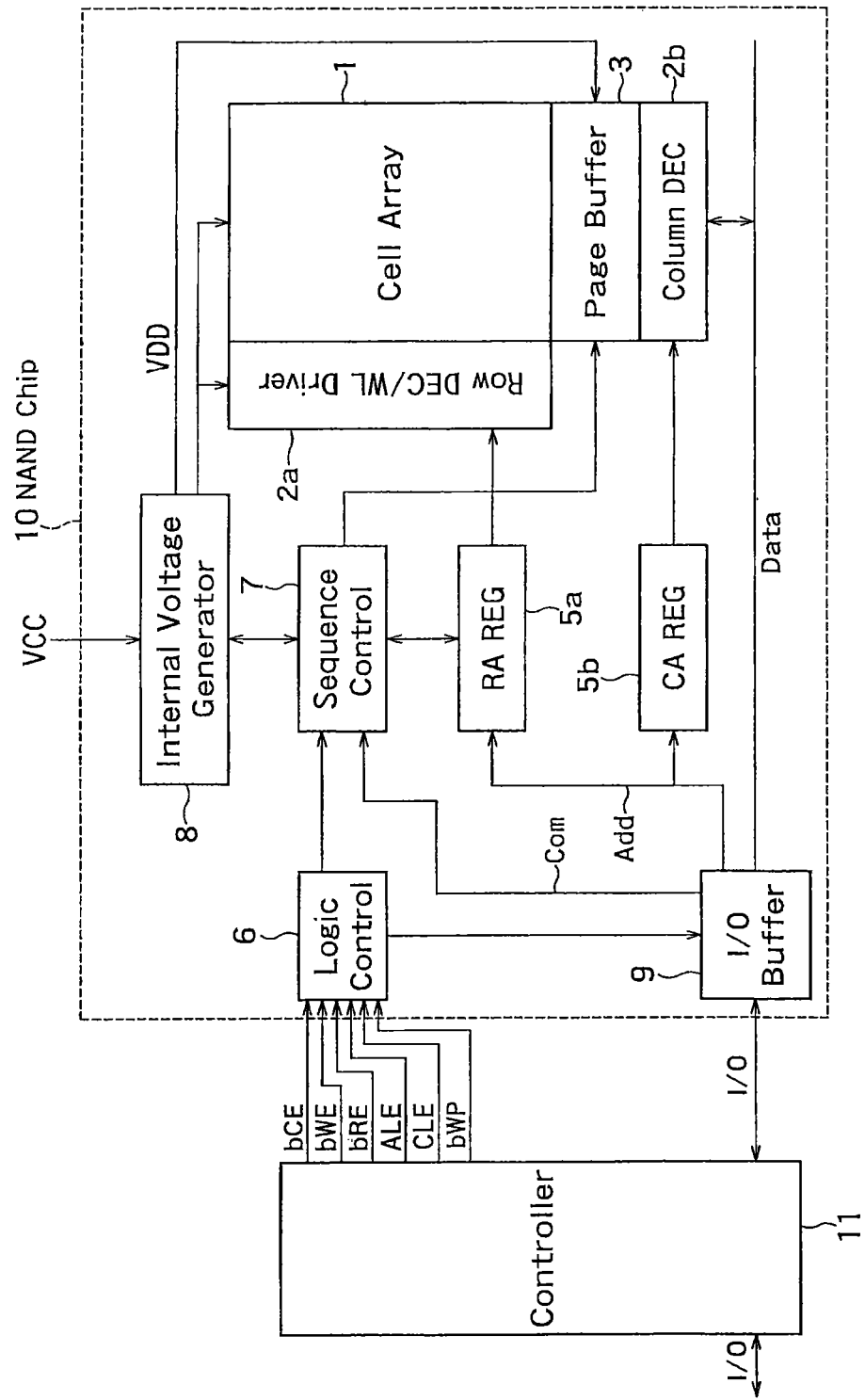
FIG. 1 is a block diagram showing an example of a configuration of a NAND flash memory according to a first embodiment.

FIG. 1 is a block diagram showing an example of a configuration of a NAND flash memory according to a first embodiment. The NAND flash memory according to the first embodiment includes a NAND chip 10 and a controller 11 controlling the NAND chip 10. The NAND chip 10 and the controller 11 can be resin-sealed into one package as a multi-chip package (MCP).

A memory cell array 1 constituting the NAND chip 10 is configured to two-dimensionally arrange a plurality of memory cells MC in a matrix. Each of these memory cells MC includes a charge accumulation layer. This memory cell MC is not limited to an FG memory cell but, for example, a MONOS memory cell can be used as the memory cell MC. A row decoder/word line driver 2a, a column decoder 2b, a page buffer 3, and an internal voltage generator 8 constitute a data write/read circuit that writes and reads data to and from every page of the memory cell array 1. The row decoder/word line driver 2a selectively drives word lines in the memory cell array 1. The page buffer 3 includes a sense amplifier circuit SA and a data holding circuit corresponding to each one of pages and reads and writes data from or to the page of the memory cell array 1.

Columns of the read data corresponding to one page of the page buffer 3 are sequentially selected by the column decoder 2b and the read data is output to an external I/O terminal via an I/O buffer 9. Columns of the write data supplied from the I/O terminal are sequentially selected by the column decoder 2b and the write data is loaded to the page buffer 3. The write data corresponding to one page is loaded to the page buffer 3. Row address signals and column address signals are input via the I/O buffer 9 and transferred to the row decoder 2a and the column decoder 2b, respectively. A row address register 5a holds an erasure-target block address in an erasure operation, and holds a page address in a write or read operation. A first column address used to load the write data before the start of the write operation or that for the read operation is input to a column address register 5b. The column address register 5b holds the input column address until a write enable signal bWE or a read enable signal bRE is toggled under predetermined conditions.

A logic control circuit 6 controls input of a command or addresses and controls input/output of data based on a control signal such as a chip enable signal bCE, a command enable signal CLE, an address latch enable signal ALE, the write enable signal bWE or the read enable signal bRE. The read operation or the write operation is performed in response to the command. A sequence control circuit 7 receives the command and controls a read sequence, a write sequence or an erasure sequence. The internal voltage generator 8 receives an external power supply voltage VCC and generates predetermined voltages necessary for various operations under the control of the sequence control circuit 7. The internal voltage generator 8 generates an internal power supply voltage VDD (described later) for the sense amplifier circuit SA.

The controller 11 performs a data write control and a data read control under conditions appropriate for a present write state of the NAND chip 10. Needless to mention, the NAND chip 10 can execute a part of the data read control.

Figure 2:
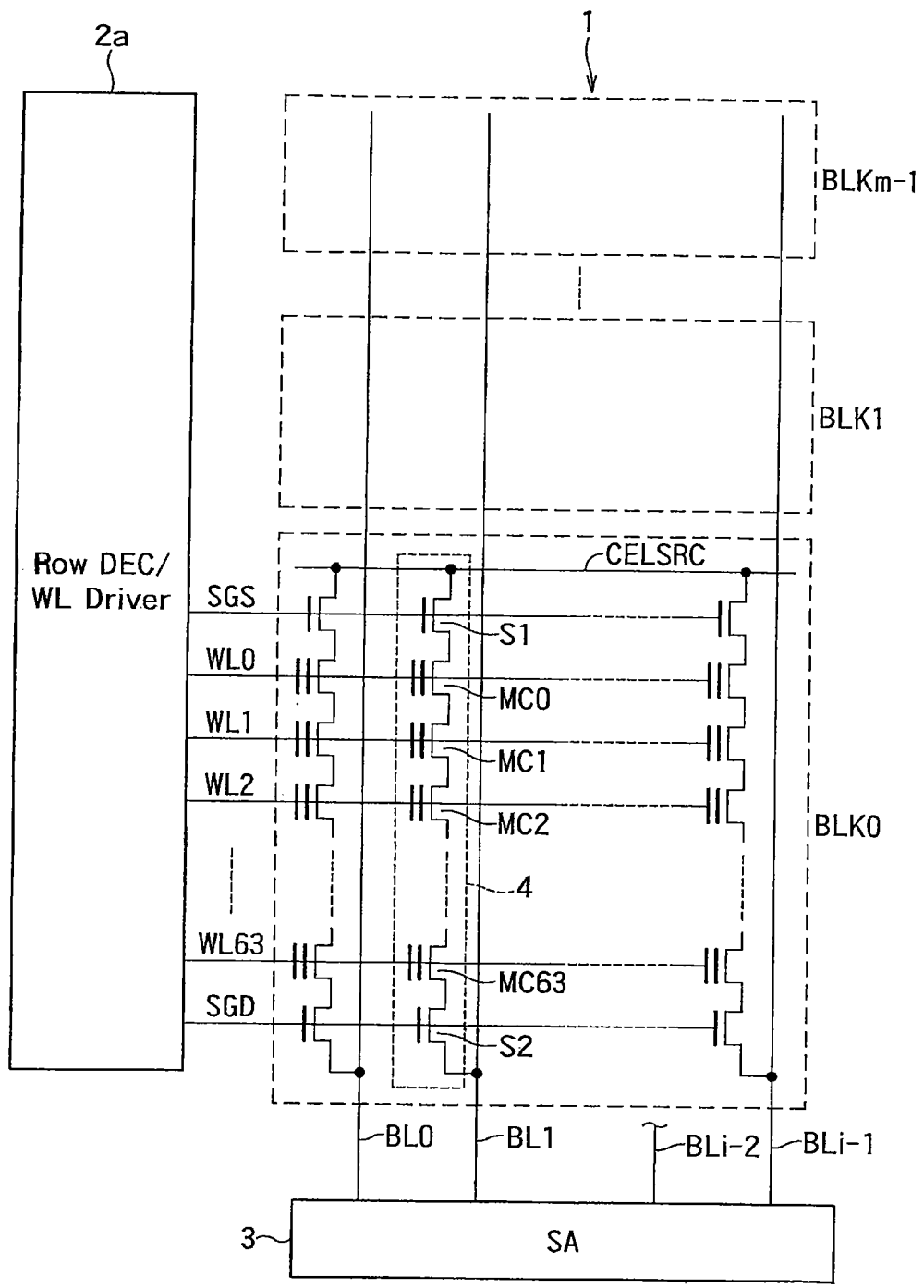
FIG. 2 shows an example of a specific configuration of the memory cell array 1.

FIG. 2 shows an example of a specific configuration of the memory cell array 1. In this example, 64 memory cells MC0 to MC63 connected in series and selection gate transistors S1 and S2 connected to both ends of the series-connected memory cells MC0 to MC63 constitute one NAND cell unit (NAND string) 4. A source of the selection gate transistor S1 is connected to a common source line CELSRC and a drain of the selection gate transistor S2 is connected to one bit line BL (one of BL0 to BLi−1). That is, the bit line BL is connected to one end of a current path for the memory cells MC. Control gates of the memory cells MC0 to MC63 are connected to word lines WL (WL0 to WL63), respectively, and gates of the selection gate transistors S1 and S2 are connected to selection gate lines SGS and SGD, respectively.

A range of a plurality of memory cells MC along one word line WL serves as one page from and to which data is read and written collectively. Furthermore, a range of a plurality of NAND cell units 4 aligned in a word line WL direction constitutes one cell block BLK from which data is erased collectively. In FIG. 2, a plurality of cell blocks BLK0 to BLKm−1 sharing the bit lines BL are arranged in a bit line BL direction and the cell blocks BLK0 to BLKm−1 constitute the memory cell array 1. The word lines WL and the selection gate lines SGS and SGD are driven by the row decoder 2a. Each bit line BL is connected to the sense amplifier circuit SA included in the page buffer 3. The sense amplifier circuit SA detects data stored in each memory cell MC selected by one bit line BL and one word line WL.

Figure 3:
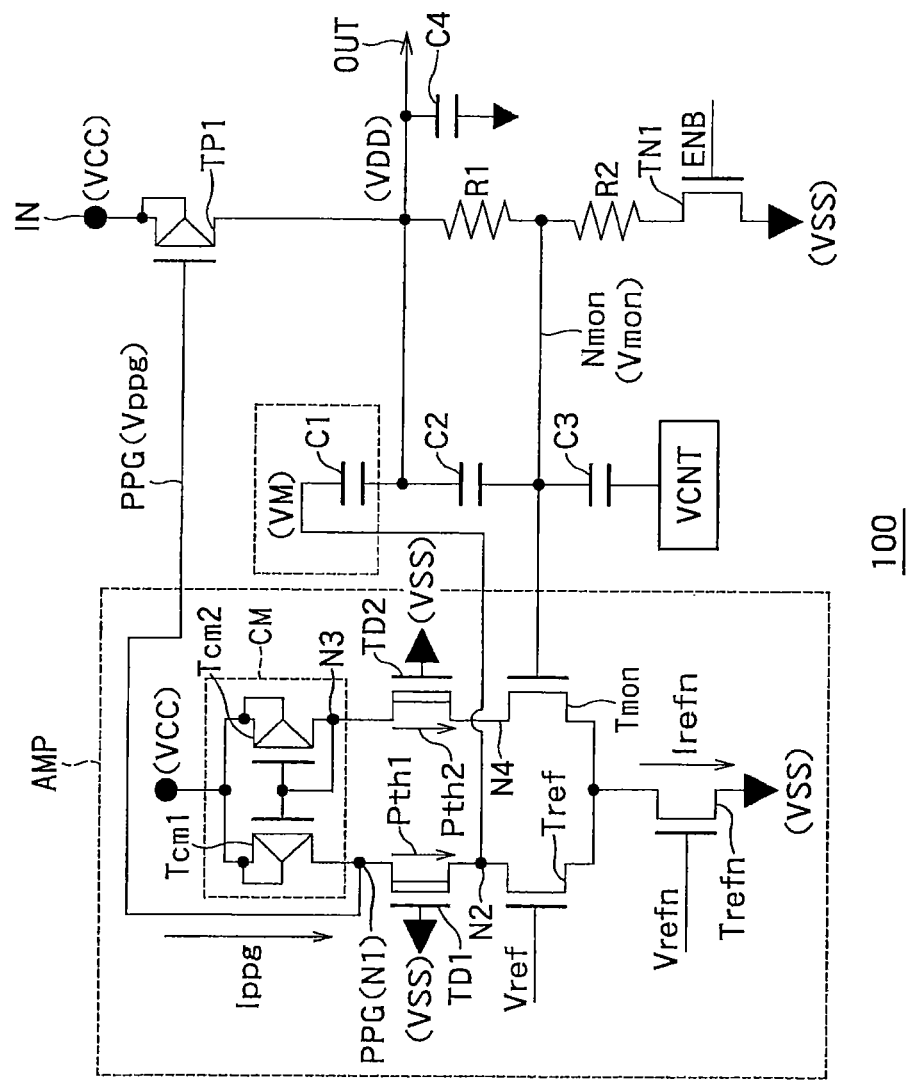
FIG. 3 is a circuit diagram showing an example of an internal-power-supply-voltage VDD generator included in the internal voltage generator 8.

FIG. 3 is a circuit diagram showing an example of an internal-power-supply-voltage VDD generator (hereinafter, "VDD generator") included in the internal voltage generator 8. A VDD generator 100 is a circuit that receives the external power supply voltage VCC serving as a first power supply voltage and that generates the internal power supply voltage VDD serving as a second power supply voltage from the external power supply voltage VCC. The VDD generator 100 can be restated as a voltage converter circuit that converts the external power supply voltage VCC into the internal power supply voltage VDD. For example, the internal power supply voltage VDD is a voltage obtained by dropping the external power supply voltage VCC and used for the memory cell array 1, peripheral circuits, and the like to operate.

The VDD generator 100 includes an input part IN, an output part Vout, an output driver TP1 serving as a voltage generation transistor, capacitors C1 and C2, a differential amplifier AMP, resistors R1 and R2, and a switching transistor TN1.

The input part IN receives the external power supply voltage VCC (hereinafter, also simply "voltage VCC" or "VCC"). The output part Vout outputs the internal power supply voltage VDD (hereinafter, also simply "voltage VDD" or "VDD") generated by the VDD generator 100 using the external power supply voltage VCC. The voltage VDD is the power supply voltage obtained by dropping the voltage VCC.

The output driver TP1 is connected between the VCC and the VDD and a gate thereof is connected to a node PPG. The gate of the output driver TP1 receives a voltage Vppg output from the differential amplifier AMP. The output driver TP1 is made into a conductive state in response to the voltage Vppg and a current according to the voltage Vppg runs through the output driver TP1. The VDD is thereby generated by resistance division between the resistors R1 and R2.

For example, the resistors R1 and R2 can be formed by changing the length, size, or layout of a wiring. That is, even when both the resistors R1 and R2 are not resistive elements, the resistors R1 and R2 can be formed by changing resistances depending on the shape of the wiring.

The switching transistor TN1 is a transistor that is turned off in a standby state of the VDD generator 100 and that is turned on in an active state thereof.

The differential amplifier AMP includes a current mirror part CM, a reference transistor Tref, a monitor transistor Tmon, a constant-current transistor Trefn, a first depletion (D-type) transistor TD1, and a second depletion (D-type) transistor TD2. The differential amplifier AMP controls the voltage Vppg using a difference that is generated between currents applied to paths Pth1 and Pth2 and that is derived from a difference between a reference voltage Vref and a monitor voltage Vmon. The differential amplifier AMP thereby adjusts a conduction state of the output driver TP1 so as to make the monitor voltage Vmon identical to the reference voltage Vref and outputs the stable VDD.

The current mirror part CM includes transistors Tcm1 and Tcm2 gates of which are connected commonly to a node N3. The transistor Tcm1 is connected between the VCC and the node PPG (a node N1). The transistor Tcm2 is connected between the VCC and the node N3. The current mirror part CM thereby applies mirrored currents in response to the VCC. At this time, the transistors Tcm1 and Tcm2 apply the currents equal to each other.

The constant-current transistor Trefn is connected between the paths Pth1 and Pth2 and a ground voltage VSS, and controlled in response to a gate voltage Vrefn. The constant-current transistor Trefn is connected commonly to the paths Pth1 and Pth2 and adjusted so that a total current applied to the paths Pth1 and Pth2 is equal to a predetermined current Irefn. That is, the constant-current transistor Trefn functions as a constant-current source.

The reference transistor Tref interposes between the current mirror part CM and the constant-current transistor Trefn and a gate thereof receives the reference voltage Vref. The reference transistor Tref is connected between a node N2 present downstream of the first depletion transistor TD1 and the constant-current transistor Trefn. The reference voltage Vref is set to a predetermined voltage and the reference transistor Tref applies a current according to the reference voltage Vref to the path Pth1.

The monitor transistor Tmon interposes between the current mirror part CM and the constant-current transistor Trefn, and a gate thereof is connected to a monitor node Nmon and receives the monitor voltage Vmon. More specifically, the monitor transistor Tmon is connected between a node N4 present downstream of the second depletion transistor TD2 and the constant-current transistor Trefn. The monitor voltage Vmon is a voltage that is obtained by dividing the internal power supply voltage VDD by the resistors R1 and R2 and that changes depending on a change in the VDD. The VDD can be transitionally changed by an operation performed by a load connected to the output part OUT (that is, an operating state of the memory). The monitor voltage Vmon monitors such a change in the VDD. The monitor transistor Tmon applies a monitor current according to the monitor voltage Vmon to the path Pth2. The monitor transistor Tmon and the reference transistor Tref have characteristics identical to each other.

The first depletion transistor TD1 is connected between the current mirror part CM and the reference transistor Tref and a gate thereof is connected to the ground voltage VSS. That is, the first depletion transistor TD1 is connected between the nodes PPG and N2 of the first path Pth1. The first depletion transistor TD1 is in a normally ON state and applies the current from the current mirror part CM to the reference transistor Tref as it is. However, when a voltage VM of the node N2 exceeds VSS+|Vthd1|, the first depletion transistor TD1 is turned off. That is, the first depletion transistor TD1 is turned off when the voltage VM of the node N2 exceeds an absolute value of a threshold voltage Vthd1 of the first depletion transistor TD1, in the case where the gate voltage (VSS) set as a basis of voltage. Therefore, the first depletion transistor TD1 keeps the voltage VM of the node N2 to be equal to or lower than the sum (VSS+|Vthd1|) of the gate voltage (VSS) and the threshold voltage (Vthd1). The first depletion transistor TD1 can thereby clamp the voltage VM of the node N2 to VSS+|Vthd1|−Vdelta1 and stabilize the voltage VM at VSS+|Vthd1|−Vdelta1. The Vdelta1 indicates a voltage necessary to apply the current running through the path Pth1 to the reference transistor Tref.

The second depletion transistor TD2 is connected between the current mirror part CM and the monitor transistor Tmon and a gate thereof is connected to the ground voltage VSS similarly to the gate of the first depletion transistor TD1. That is, the second depletion transistor TD2 is connected between the nodes N3 and N4 of the second path Pth2. The second depletion transistor TD2 is in a normally ON state and applies the current from the current mirror part CM to the monitor transistor Tmon as it is. The second depletion transistor TD2 is provided to correspond to the first depletion transistor TD1, whereby a balance is kept between the paths Pth1 and Pth2 and the paths Pth1 and Pth2 are allowed to normally function as a differential pair. A threshold voltage Vthd2 of the second depletion transistor TD2 is identical to the threshold voltage Vthd1 of the first depletion transistor TD1.

A gate of the output driver TP1 is connected to the node PPG between the current mirror part CM and the reference transistor Tref. A voltage of the node PPG, that is, the voltage Vppg controls the output driver TP1. The output driver TP1 thereby generates the VDD from the VCC as described above.

One end of the first capacitor C1 is connected to the output part OUT and the other end thereof is connected to the node N2. The differential amplifier AMP requires a certain amount of time since a feedback of the change in the VDD by the monitor voltage Vmon until the reflection of the feedback in the voltage Vppg (generates a delay between the feedback of the change in the VDD by the monitor voltage Vmon and the reflection of the feedback in the voltage Vppg). When this delay causes a large shift between a change phase of the voltage VDD and a phase of the voltage Vppg, the voltage VDD often oscillates. The capacitor C1 is provided to suppress oscillations caused by such a delay. That is, the capacitor C1 is a phase compensation capacitor. The capacitor C1 can suppress the transient change in the voltage VDD by feeding back the voltage VDD to the node N2 because the voltage VM of the node N2 is kept to VSS+|Vthd1|−Vdelta1.

The second capacitor C2 is connected between the output part OUT and the monitor node Nmon. When the load is suddenly generated from a no-load state in the active state, the voltage VDD falls. At this time, the monitor voltage Vmon transmits (feeds back) the change in the voltage VDD in a short time because of the interposition of the capacitor C2 between the output part OUT and the monitor node Nmon. The VDD generator 100 can thereby return the voltage VDD to a predetermined voltage in a short time even if the load is suddenly increased in the active state and current consumption grows.

The third capacitor C3 is connected between a voltage controller VCNT and the monitor node Nmon. The monitor voltage Vmon is identical to the voltage VDD in the standby state. At a time of a transition from the standby state to the active state, it is necessary to decrease the monitor voltage Vmon to be closer to the reference voltage Vref. At this time, the voltage controller VCNT can decrease the monitor voltage Vmon from the voltage VDD to be closer to the reference voltage Vref via the capacitor C3 in a short time. The VDD generator 100 can thereby transition from the standby state to the active state in a short time.

The fourth capacitor C4 is connected between the output part OUT and the VSS and provided to stabilize the voltage VDD output from the output part OUT.

Figure 4:
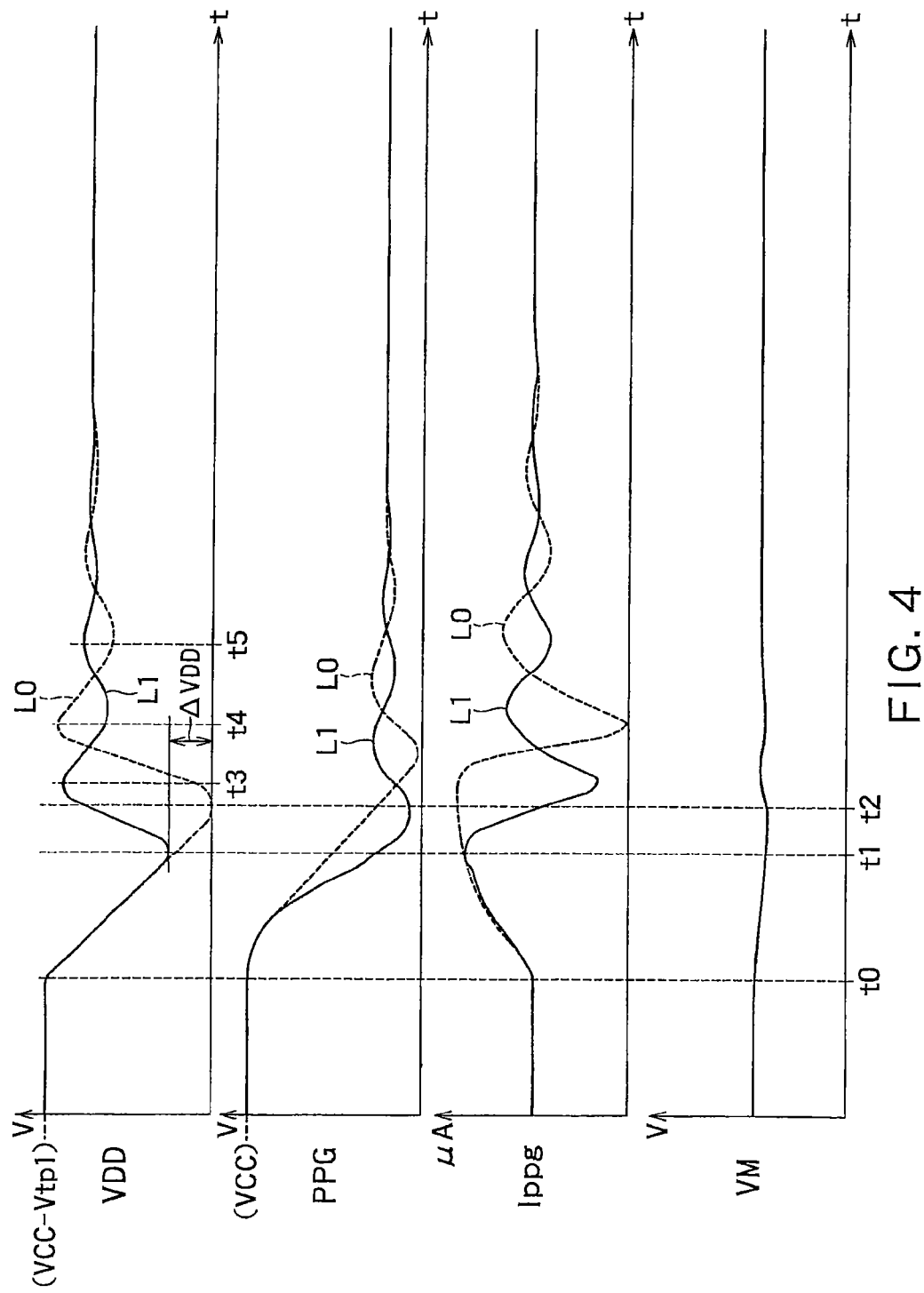
FIG. 4 is a timing chart showing an example of an operation performed by the VDD generator 100 at the time of a transition from a standby state to an active state.

FIG. 4 is a timing chart showing an example of an operation performed by the VDD generator 100 at the time of a transition from a standby state to an active state. A solid line L1 represents a graph showing the operation performed by the VDD generator 100 according to the first embodiment. A broken line L0 represents an operation performed by a VDD generator having the capacitor C1 connected between the node PPG and the output part OUT.

Before a time t0, the VDD generator 100 is in the standby state. The node PPG is charged with the voltage VCC as the voltage Vppg by a reset circuit (not shown in FIG. 3), and the output part OUT is charged with a predetermined voltage as the voltage VDD by a standby generator.

For example, at the time t0, the VDD generator 100 transitions from the standby state to the active state. At this time, the transistor TN1 is turned on. Because the load connected to the output part OUT is increased, the voltage VDD greatly falls. At this time, the voltage controller VCNT decreases the monitor voltage Vmon via the capacitor C3 and the capacitor C2 transmits a decrease in the VDD to the monitor voltage Vmon. The voltage VDD is divided by the resistors R1 and R2 and the resultant voltage is transmitted to the monitor node Nmon shown in FIG. 3. The monitor voltage Vmon thereby falls and the monitor transistor Tmon is nearly turned off. At this time, a potential of the node N3 rises, so that the current mirror part CM decreases the mirrored currents applied to the paths Pth1 and Pth2. However, the constant-current transistor Trefn is intended to apply the constant current Irefn. This causes the charge to be extracted from the node PPG on the path Pth1, and a potential of the node PPG falls as shown in FIG. 4. That is, a current Ippg applied from the node PPG to the path Pth1 increases and the potential of the node PPG falls. From a time t1 to a time t3, the output driver TP1 is thereby strongly turned on, resulting in an increase in the voltage VDD.

When the voltage VDD exceeds a desired voltage by the increase, the increase in the voltage VDD is fed back again to the differential amplifier AMP via the monitor node Nmon. From the time t3 to a time t4, the output driver TP1 is thereby weakly turned on, resulting in the decrease in the voltage VDD.

When the voltage VDD falls below the desired voltage by the decrease, the decrease in the voltage VDD is fed back again to the differential amplifier AMP via the monitor node Nmon. From the time t4 to a time t5, the output driver TP1 is thereby strongly turned on again, resulting in the increase in the voltage VDD. In this way, the voltage VDD repeatedly rises and falls and converges into the desired voltage.

It is assumed here that the phase compensation capacitor C1 is connected between the node PPG and the output part OUT. In this case, a capacity of the node PPG increases. As indicated by the L0 shown in FIG. 4, the voltage Vppg of the node PPG either falls or rises over a long time in proportion to an increase in the capacity of the node PPG. The voltage VDD thereby greatly oscillates for a long time. For example, from the time t0 to the time t2, the voltage VDD greatly falls.

On the other hand, according to the VDD generator 100 of the first embodiment, the phase compensation capacitor C1 is connected between the node N2 and the output part OUT. Because of a small voltage change of the node N2, a quantity of charge accumulated in the capacity of the node PPG is small and the voltage of the node PPG can be returned in a short time at a time when the differential amplifier AMP performs a feedback operation (see the L1 shown in FIG. 4). That is, an operation of the voltage Vppg according to the first embodiment is weak and can be easily adjusted by a small flow of charge from the node PPG. This can make oscillations of the voltage VDD small and can make the time until the voltage VDD converges short. For example, from the time t0 to the time t1, the voltage VDD falls on the L1; however, the decrease in the voltage VDD on the L1 is slighter than that on the L0 by $\Delta$VDD. Furthermore, a decrease time (t0 to t1) of the voltage VDD and a return time (t1 to t3) of the voltage VDD on the L1 are shorter than a decrease time (t0 to t2) of the voltage VDD and a return time (t2 to t4) of the voltage VDD on the L0, respectively.

In this way, according to the first embodiment, it is possible to reduce the capacity of the node PPG, shorten the return time of the internal power supply voltage VDD, and reduce oscillations of (decrease in) the internal power supply voltage VDD by connecting the capacitor C1 to the node N2 present between the depletion transistor TD1 and the reference transistor Tref. The reduction in oscillations of the internal power supply voltage VDD can make the return time of the internal power supply voltage VDD shorter and can make the internal power supply voltage VDD stable earlier. This can ensure that the VDD generator 100 has more flexibility for specifications.

Furthermore, according to the first embodiment, the first depletion transistor TD1 is connected between the nodes PPG and N2. The gate of the first depletion transistor TD1 is connected to the ground voltage VSS. As indicated by the VM shown in FIG. 4, the potential of the node N2 to which the capacitor C1 is connected is thereby kept to be equal to or lower than |Vthd1|−Vdelta1 with the VSS set as a reference (zero). The capacitor C1 can thereby suppress the transient change in the voltage VDD and normally function as the phase compensation capacitor. On the other hand, the potential of the node PPG is determined according to the currents applied to the differential pair of the paths Pth1 and Pth2 by the current mirror part CM and the constant-current transistor Tref. Therefore, the differential amplifier AMP can adjust the voltage Vppg so as to make the monitor voltage Vmon identical to the reference voltage Vref. Furthermore, the second depletion transistor TD2 is provided on the path Pth2 to correspond to the first depletion transistor TD1. It is thereby possible to keep the differential pair in balance.

FIG. 4 shows an operation relating to a transition from a standby state to an active state. However, even if the load is suddenly increased and the voltage VDD sharply falls in the active state, the operation of the VDD generator 100 is basically similar to that according to the first embodiment described above.

In the first embodiment, the voltage change of the node N2 is suppressed by setting the voltages of the gates of the first and second depletion (D-type) transistors TD1 and TD2 to the VCC using the first and second depletion (D-type) transistors TD1 and TD2. Alternatively, enhancement (E-type) transistors can be used in place of the D-type transistors, and the voltage change of the node N2 can be suppressed by applying a constant voltage to gates of these E-type transistors. Also with this configuration, effects identical to those of the first embodiment can be obtained.

Second Embodiment

Figure 5:
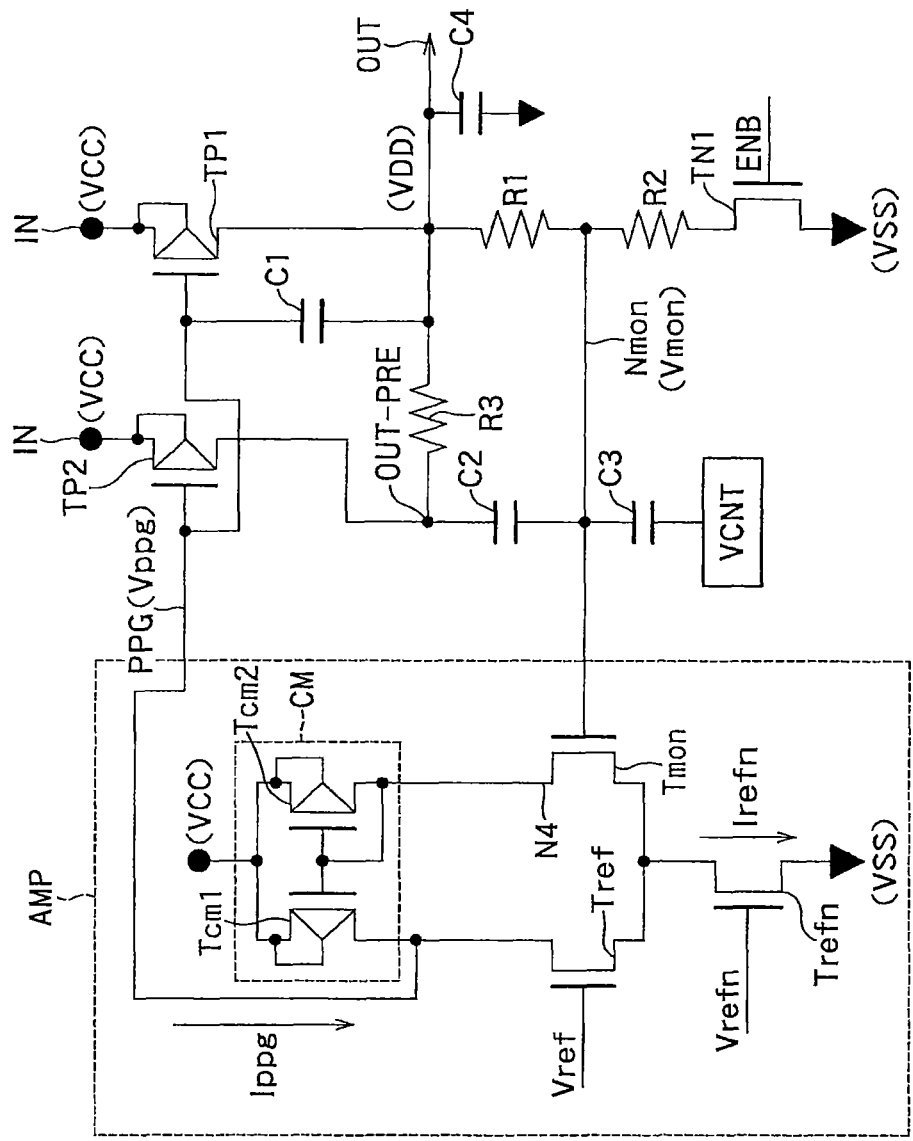
FIG. 5 is a circuit diagram showing an example of a VDD generator 200 according to a second embodiment.

FIG. 5 is a circuit diagram showing an example of a VDD generator 200 according to a second embodiment. The VDD generator 200 further includes an output driver TP2 and a delay resistor R3 (hereinafter, also simply "resistor R3"). The output drivers TP1 and TP2 are substantially identical in characteristics (for example, substantially identical in a threshold voltage). Similarly to the resistors R1 and R2, the resistor R3 can be formed by changing a resistance depending on the shape of a wiring. That is, even if the resistor R3 is not a resistive element, the resistor R3 can be formed by changing the resistance depending on the shape of the wiring.

A gate of the output driver TP2 and the gate of the output driver TP1 are connected commonly to the node PPG. Furthermore, one end of the output driver TP2 is connected to the external power supply voltage VCC similarly to the output driver TP1. However, differently from the output driver TP1, the other end of the output driver TP2 is connected to the output part OUT via the delay resistor R3. The delay resistor R3 is connected between the first capacitor C1 and the second capacitor C2. For example, the delay resistor R3 is a resistor formed by using a metallic wiring and has the resistance of tens of ohms. Moreover, the VDD generator 200 does not include the depletion transistors TD1 and TD2. Other configurations of the second embodiment can be identical to those corresponding to the first embodiment.

In the second embodiment, an output driver is divided into two (TP1 and TP2). While the output driver TP1 is equivalent to the output driver TP1 according to the first embodiment, the output driver TP2 is connected to the output part OUT via the delay resistor R3. The relatively large capacitor C4 is connected to the output part OUT so as to stabilize the voltage VDD. The delay resistor R3 makes a capacity of a node OUT_PRE instantaneously appear smaller than the capacity of the output part OUT. Therefore, at a time of a change in the voltage Vppg of the node PPG, a voltage of the node OUT_PRE on a drain side of the output driver TP2 reacts more quickly than a voltage on a drain side of the output driver TP1. The output driver TP2 can transmit the change in the VDD to the monitor node Nmon earlier than the output driver TP1 because the output driver TP2 has the characteristics identical to those of the output driver TP1. That is, before the change in the voltage VDD of the output part OUT is transmitted to the monitor node Nmon via the resistor R1, the output driver TP2 transmits the change in the VDD to the monitor node Nmon via the capacitor C2. In other words, before the voltage VDD of the output part OUT greatly changes, the output driver TP2 can feed back the change in the voltage VDD to the differential amplifier AMP. It is thereby possible to prompt the differential amplifier AMP to react more quickly, suppress an excessive change in the voltage Vppg of the node PPG, and make a gradient of the return of the voltage VDD of the output part OUT more gradual.

Figure 6:
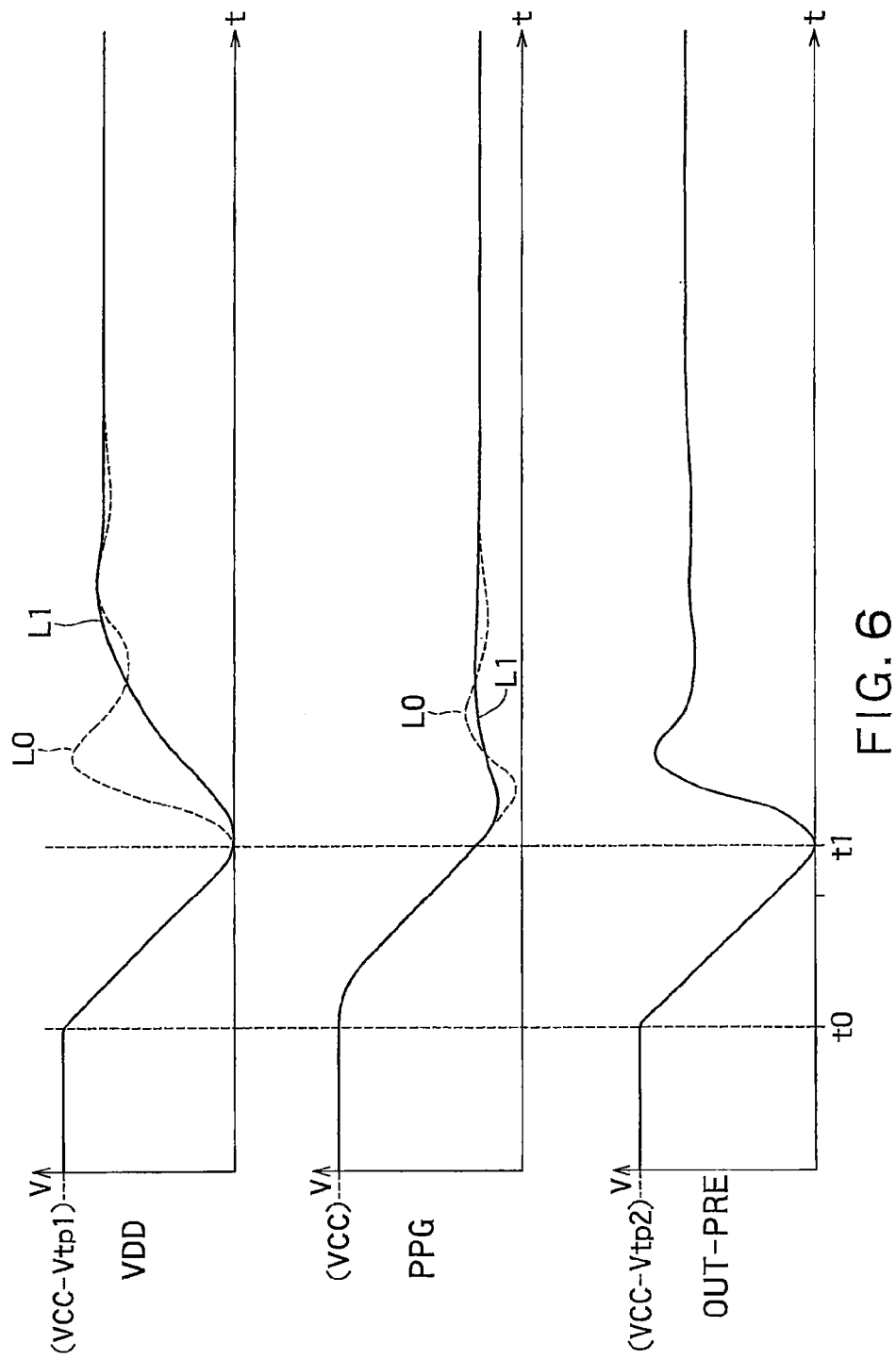
FIG. 6 is a timing chart showing an example of an operation performed by the VDD generator 200 at a time when the internal power supply voltage VDD falls.

FIG. 6 is a timing chart showing an example of an operation performed by the VDD generator 200 at a time when the internal power supply voltage VDD falls. The solid line L1 represents a graph showing the operation performed by the VDD generator 200 including the output driver TP2 and the delay resistor R3. The broken line L0 represents a graph showing an operation performed by a VDD generator that does not include the output driver TP2 and the delay resistor R3.

For example, when a heavy load is generated on the output part OUT, the voltage VDD greatly falls (t0 to t1). In this case, the differential amplifier AMP decreases the voltage Vppg so as to return the voltage VDD to the predetermined voltage in response to the feedback of the monitor voltage Vmon. The output driver TP1 is thereby strongly turned on and prompted to supply a large quantity of charge to the output part OUT in a short time.

At this time, when the VDD generator does not include the output driver TP2 and the resistor R3, the transient change in the VDD is fed back to the monitor voltage Vmon of the monitor node Nmon via the capacitor C2. However, because of a large sum of capacities of the capacitors C2 and C4, the feedback is delayed. During a delay period, the voltage Vppg excessively falls and the voltage VDD of the output part OUT returns to an excessive level. At this time, the voltage VDD of the output part OUT excessively rises to be higher than the predetermined voltage, so that the differential amplifier AMP is prompted to further decrease the voltage VDD of the output part OUT in response to the feedback. After repeating such a ringing operation, the voltage VDD of the output part OUT converges into the predetermined voltage (see the L0).

In this way, when the VDD generator does not include the output driver TP2 and the resistor R3, the voltage VDD of the output part OUT returns to the predetermined voltage very quickly as indicated by the L0. This makes a gradient of the change in the voltage VDD sharp. When the gradient of the change in the voltage VDD is sharp, a delay time of a circuit operating by the voltage VDD used as a power supply changes, resulting in deterioration of a duty ration of output signals output from the circuit. The duty ration is a percentage of time of the signals (0 and 1). A speed of an output signal decreases when the voltage VDD is low. Conversely, the speed of the output signal increases when the voltage VDD is high. Therefore, when the voltage VDD sharply rises, a next signal is output at an earlier timing after a certain signal is output in a delayed state. That is, when the gradient of the increase in the voltage VDD is sharp, an interval of the output signals is extremely narrow (the duty ration deteriorates). When the interval of the output signals is narrow, there is a probability that an external device that receives the output signals is unable to correctly recognize the output signals.

On the other hand, the VDD generator 200 according to the second embodiment is configured so that the output driver is divided into two (TP1 and TP2), and so that the output driver TP2 is connected to the output part OUT via the resistor R3 and connected to the monitor node Nmon via the capacitor C2. Therefore, before the voltage VDD of the output part OUT greatly changes, the output driver TP2 can feed back the change in the voltage VDD to the differential amplifier AMP via the node OUT_PRE and the capacitor C2. This can prompt the differential amplifier AMP to react more quickly and make the gradient of the return of the voltage VDD of the output part OUT more gradual (see the L1).

For example, when a heavy load is generated on the output part OUT, the voltage VDD greatly falls. In this case, the differential amplifier AMP decreases the voltage Vppg so as to return the voltage VDD to the predetermined voltage in response to the feedback of the monitor voltage Vmon. The output driver TP1 is thereby strongly turned on and supplies the charge to the output part OUT. At this time, according to the second embodiment, the output driver TP2 transmits the change in the voltage VDD to the monitor node Nmon via the node OUT_PRE and the capacitor C2 before the change in the voltage VDD of the output part OUT is transmitted to the monitor node Nmon via the resistor R1 and the capacitor C2. This can make a delay period of an operation performed by the differential amplifier AMP relatively short, suppress the voltage Vppg from excessively falling as indicated by the L1 shown in FIG. 6, and make the gradient of the return of the voltage VDD of the output part OUT more gradual. That is, the voltage of the node OUT_PRE reacts earlier than the voltage VDD of the output part OUT in response to an operation performed by the output driver TP2. This enables the monitor voltage Vmon to return quickly. Therefore, the differential amplifier AMP reacts quickly to the change in the voltage VDD, suppresses the excessive decrease in the voltage Vppg, and makes the change in the voltage Vppg gradual. By making the change in the voltage Vppg gradual, the voltage VDD of the output part OUT gradually rises toward the predetermined voltage.

As described above, in the VDD generator 200 according to the second embodiment, the gradient of the change in the voltage VDD is made gradual. When the gradient of the change in the voltage VDD is slight, a change in the duty ration of the output signals output from the circuit that operates by the voltage VDD used as the power supply is small. For example, in a case where the voltage VDD gradually rises, the next signal is output in a delayed state to some extent even if a certain signal is output in a delayed state. That is, when the gradient of the increase in the voltage VDD is gradual, the interval of the output signals does not become extremely narrow (change in the duty ratio is small) although the interval is narrowed to some extent. This can decrease the probability that the external device receiving the output signals erroneously recognizes the output signals.

Figure 7:
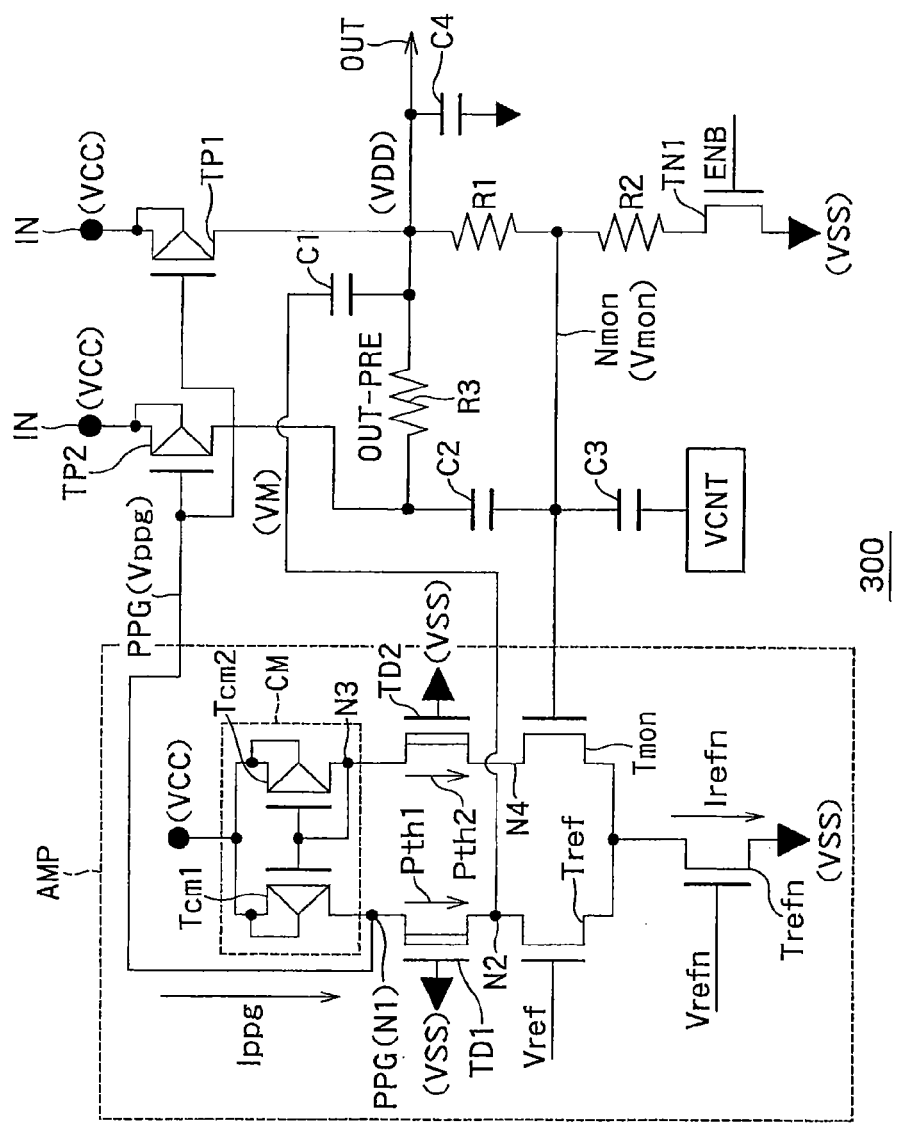
FIG. 7 is a circuit diagram showing an example of a VDD generator 300 according to a combination of the first and second embodiments.

The second embodiment can be combined with the first embodiment. FIG. 7 is a circuit diagram showing an example of a VDD generator 300 according to a combination of the first and second embodiments. The VDD generator 300 can perform both the operation according to the first embodiment and that according to the second embodiment, and obtain the effects of both of the first and second embodiments.

Third Embodiment

Figure 8:
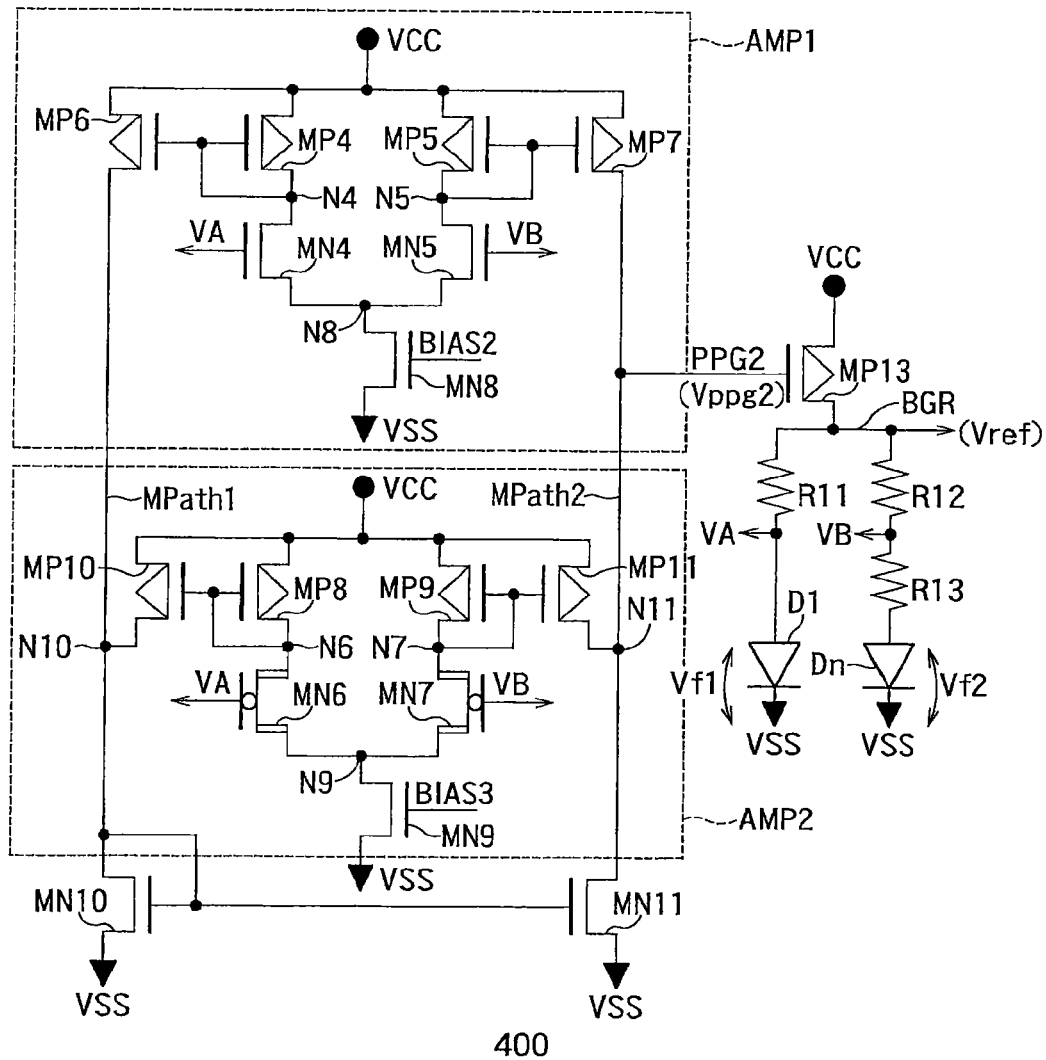
FIG. 8 is a circuit diagram showing an example of a BGR circuit 400 according to a third embodiment.

FIG. 8 is a circuit diagram showing an example of a BGR (Band Gap Reference) circuit 400 according to a third embodiment. The BGR circuit 400 is a circuit for generating the reference voltage Vref and provided separately from the VDD generators 100, 200 or 300 in the internal voltage generator 8 shown in FIG. 1.

The BGR circuit 400 includes a first differential amplifier AMP1, a second differential amplifier AMP2, resistors R11 to R13, diodes D1 and Dn, and a voltage generation transistor MP13.

The voltage generation transistor MP13 is connected between the external power supply voltage VCC and a node BGR. A gate of the voltage generation transistor MP13 receives a voltage Vppg2 from the differential amplifiers AMP1 and AMP2, and the voltage generation transistor MP13 generates the reference voltage Vref.

The resistor R11 and the diode D1 are connected in series between the node BGR and the ground voltage VSS. Similarly, the resistors R12 and R13 and the diode Dn are connected in series between the node BGR and the ground voltage. That is, the resistor RR and the diode D1 are connected to the resistors R12 and 13 and the diode Dn in parallel between the node BGR and the ground voltage VSS.

A voltage VA between the resistor R11 and the diode D1 and a voltage VB between the resistors R12 and R13 are identical to the VA and VB of the differential amplifiers AMP1 and AMP2, respectively.

The diode Dn is a diode formed by connecting n diodes D1 in parallel. Note that n is an integer equal to or greater than 2. A voltage applied to both ends of the diode D1 is Vf1 and that applied to both ends of the diode Dn is Vf2. In this case, the reference voltage Vref is represented by the following Expression (1).

$$Vref = Vf1 + (R12/R13) \times VT \times \ln(n \times (R12/R11)) \quad \text{(Expression 1)}$$

In the Expression (1), VT indicates a thermoelectromotive force and is expressed as kT/q (where k is the Boltzmann constant, T is an absolute temperature, and q is electron charge). By appropriately selecting the resistors R11 to R13 based on the Expression (1), a temperature gradient of the reference voltage Vref can be adjusted. By setting the resistors R11 to R13 so as to make a coefficient of a temperature T as close to zero as possible, the BGR circuit 400 can output the constant Vref irrespective of the temperature T. For example, the reference voltage Vref is fixed to about 1.25 V.

Meanwhile, the voltages VA and VB are determined by the voltage Vf1 applied to the diode D1. Generally, a diode has negative temperature characteristics, so that the voltages VA and VB have similarly negative temperature characteristics. The voltages VA and VB are connected to a differential pair of the differential amplifiers AMP1 and AMP2 and adjusted to be identical to each other (VA=VB). For example, at a low temperature of −40 degree, the voltages VA and VB are about 0.8 V. For example, at a high temperature of 125 degrees, the VA and VB are about 0.5 V. In this way, the voltages VA and VB have the negative temperature characteristics and become low at a high temperature. Accordingly, transistors having a low threshold voltage are used as n-type transistors MN6 and MN7 of the differential amplifier AMP 2 that receive the voltages VA and VB.

(Pentode Operation Performed by AMP2)

The differential amplifier AMP2 includes n-type transistors (hereinafter, also simply "transistors") MN6, MN7, MN9 and p-type transistors (hereinafter, also simply "transistors") MP8 to MP11. The p-type transistor MP8 is connected between the VCC and a node N6. The p-type transistor MP10 is connected between the VCC and a node N10. Gates of the p-type transistors MP8 and MP10 are connected commonly to the node N6. The p-type transistors MP8 and MP10 thereby form a current mirror part. The p-type transistor MP9 is connected between the VCC and a node N7. The p-type transistor MP11 is connected between the VCC and a node N11 (a node PPG2). Gates of the p-type transistors MP9 and MP11 are connected commonly to the node N7. The p-type transistors MP9 and MP11 thereby similarly form a current mirror part.

The p-type transistors MP8 to MP11 have identical characteristics (for example, an identical threshold voltage). Therefore, the p-type transistors MP8 to MP11 apply mirrored currents identical to each other.

The n-type transistor MN6 is connected between the node N6 and a node N9. The n-type transistor MN7 is connected between the nodes N7 and N9. The constant-current transistor MN9 is connected between the node N9 and the VSS.

The p-type transistor MP10 is connected to the node N10 of a main path Mpath1 and applies the mirrored current to the main path Mpath1 from the VCC. The p-type transistor MP11 is connected to the node N11 of a main path Mpath2 and applies the mirrored current to the main path Mpath2 from the VCC.

The n-type transistor MN10 is connected between the node N10 and the VSS and the n-type transistor MN11 is connected between the node N11 and the VSS. Gates of the n-type transistors MN10 and MN11 are connected commonly to the node N10 and the n-type transistors MN10 and MN11 constitute a current mirror part. The n-type transistors MN10 and MN11 apply identical mirrored currents to the main paths Mpath1 and Mpath2, respectively.

The node N11 is the node PPG2 and connected to the gate of the voltage generation transistor MP13.

It is assumed here that the transistors MN6 and MN7 have an identical threshold voltage Vthn1, and that the transistors MP8 to MP11 have an identical threshold voltage Vthp1. On this assumption, the voltages VA and VB have an upper limit and a lower limit so that the transistors MN6 to MP11 constituting the differential amplifier AMP2 can perform a pentode operation. The upper limit of the voltages VA and VB of the differential amplifier AMP2 can be represented by the following Expression (2).

$$VCC - (|Vthp1| + Vovp8) + Vthn1 \quad \text{(Expression 2)}$$

For example, to apply a certain current I1 to the p-type transistor MP8 (or MP9) in a state where the p-type transistor MP8 (or MP9) is turned on, it is necessary to apply VCC−(|Vthp1|+Vovp8) to a gate of the transistor MP8 (or MP9). That is, to apply the current I1 to the transistor MP8 (or MP9), a voltage of the node N6 (or the node N7) needs to be at least VCC−(|Vthp1|+Vovp8). In the Expression (2), Vovp8 indicates a voltage (an overdrive voltage) necessary to apply the current I1 to the transistor MP8 (or MP9) in an ON-state.

The n-type transistor MN6 (or MN7) performs the pentode operation with a voltage higher than the voltage of the node N6 by the threshold voltage Vthn1 set as an upper limit of a gate voltage of the n-type transistor MN6 (or MN7). Therefore, a requirement that the transistors MN6 to MP11 perform the pentode operation is that the voltages VA and VB are equal to or lower than a voltage represented by the Expression (2).

For example, when the VCC is 1.6 V, the Vthp1 is −0.6 V, the Vovp8 is 0.2 V, and the Vthn1 is −0.2 V, the voltage represented by the Expression (2) is 0.6 V. That is, when the voltages VA and VB are equal to or lower than 0.6 V, the differential amplifier AMP2 can operate normally as an analog circuit.

In this case, for example, when the voltages VA and VB are about 0.5 V at the high temperature of 125 degrees as described above, the differential amplifier AMP2 operates normally. However, when the voltages VA and VB are about 0.8 V at the low temperature of −40 degree as described above, the differential amplifier AMP2 does not operate normally. That is, when the n-type transistors MN6 and MN7 having the low threshold voltage Vthn1 are used, then an upper limit of a pentode operation range of the differential amplifier AMP2 is lowered, and the differential amplifier AMP2 does not operate normally at a time of a low temperature or the like. The upper limit of the voltages VA and VB of the differential amplifier AMP2 is also lowered when the VCC is low, |Vthp1| is high, the Vovp8 is high or Vthn1 is low in the Expression (2) besides at the time of a low temperature. In such a case, some of the transistors MN6 to MP11 of the differential amplifier AMP2 perform a triode operation, resulting in insufficient gain. A range of the VA and VB in which the differential amplifier AMP1 or AMP2 or each of the transistors of the BGR circuit 400 performs the pentode operation is also referred to as "pentode operation range", hereinafter.

On the other hand, the lower limit of the VA and VB so as to enable the transistors MN6 to MP11 constituting the differential amplifier AMP2 to perform the pentode operation can be represented by the following Expression (3).

$$Vovn9+Vthn1+Vovn6 \quad \text{(Expression 3)}$$

In the Expression (3), Vovn9 indicates an overdrive voltage necessary to apply the current I1 to the transistor MN9 in an ON-state. Vovn6 indicates an overdrive voltage necessary to apply the current I1 to the transistor MN6 (or MN7) in an ON-state. It is assumed that the transistor MN9 performs the pentode operation by a gate voltage BIAS3.

The n-type transistor MN6 (or MN7) performs the pentode operation with a voltage represented by the Expression (3) set as the lower limit of the VA and VB. Therefore, a requirement that the transistors MN6, MN7, MN8, and MP8 to MP11 of the differential amplifier AMP2 perform the pentode operation is that the voltages VA and VB are equal to or higher than the voltage represented by the Expression (3).

For example, when the Vthn1 is −0.2 V and the Vovn9 and Vovn6 are 0.2 V, the voltage represented by the Expression (3) is 0.2 V. That is, when the voltages VA and VB are equal to or higher than 0.2 V, the differential amplifier AMP2 can operate normally as the analog circuit.

In this case, for example, when the voltages VA and VB are either about 0.8 V at the low temperature of −40 degree or about 0.5 V at the high temperature of 125 as described above, the differential amplifier AMP2 operates sufficiently normally. That is, when the n-type transistors MN6 and MN7 having the relatively low threshold voltage Vthn1 are used, then a lower limit of the pentode operation range of the differential amplifier AMP2 can be sufficiently lowered.

From the above configurations, the differential amplifier AMP2 has flexibility at a high temperature or the like but possibly does not operate normally at a low temperature or the like. Considering the possible problem, the differential amplifier AMP1 is provided to compensate for the operation performed by the differential amplifier AMP2. Because the voltages VA and VB are high at a low temperature, transistors having a higher threshold voltage than that of the transistors MN6 and MN7 are used as n-type transistors MN4 and MN5 of the differential amplifier AMP1.

(Pentode Operation Performed by AMP1)

The differential amplifier AMP1 includes n-type transistors (hereinafter, also simply "transistors") MN4, MN5, MN8 and p-type transistors (hereinafter, also simply "transistors") MP4 to MP7. The p-type transistor MP4 is connected between the VCC and the node N4. The p-type transistor MP6 is connected between the VCC and the node N10. Gates of the p-type transistors MP4 and MP6 are connected commonly to the node N4. The p-type transistors MP4 and MP6 thereby form a current mirror part. The p-type transistor MP5 is connected between the VCC and a node N5. The p-type transistor MP7 is connected between the VCC and the node N11 (the node PPG2). Gates of the p-type transistors MP5 and MP7 are connected commonly to the node N5. The p-type transistors MP5 and MP7 thereby similarly form a current mirror part.

The p-type transistors MP4 to MP7 have identical characteristics (for example, an identical threshold voltage). Therefore, the p-type transistors MP4 to MP7 apply mirrored currents identical to each other.

The n-type transistor MN4 is connected between the node N4 and a node N8. The n-type transistor MN5 is connected between the nodes N5 and N8. The constant-current transistor MN8 is connected between the node N8 and the VSS.

The p-type transistor MP6 is present on the main path Mpath1 and applies the mirrored current to the main path Mpath1 from the VCC. The p-type transistor MP7 is present on the main path Mpath2 and applies the mirrored current to the main path Mpath2 from the VCC.

It is assumed here that the transistors MN4 and MN5 have an identical threshold voltage Vthn2 (Vthn2>Vthn1), and that the p-type transistors MP4 to MP7 have the threshold voltage Vthp1 identical to that of the transistors MP8 to MP11. On this assumption, the voltages VA and VB have an upper limit and a lower limit so that the transistors MN4 to MP7 constituting the differential amplifier AMP1 can perform the pentode operation. The upper limit of the voltages VA and VB of the differential amplifier AMP1 can be represented by the following Expression (4).

$$VCC-(|Vthp1|+Vovp4)+Vthn2 \quad \text{(Expression 4)}$$

In the Expression (4), Vovp4 indicates an overdrive voltage necessary to apply the current I1 to the transistor MP4 (or MP5) in an ON-state.

For example, when the VCC is 1.6 V, the Vthp1 is −0.6 V, the Vovp4 is 0.2 V, and the Vthn2 is 0.3 V, a voltage represented by the Expression (4) is 1.1 V. That is, when the voltages VA and VB are equal to or lower than 1.1 V, the differential amplifier AMP1 can operate normally as an analog circuit.

In this case, for example, when the voltages VA and VB are either about 0.5 V at the high temperature of 125 degrees or about 0.8 V at the low temperature of −40 degree as described above, the differential amplifier AMP1 operates sufficiently normally.

On the other hand, the lower limit of the VA and VB can be represented by the following Expression (5).

$$Vovn8+Vthn2+Vovn4 \quad \text{(Expression 5)}$$

In the Expression (5), Vovn8 indicates an overdrive voltage necessary to apply the current I1 to the transistor MN8 in an ON-state. Vovn4 indicates an overdrive voltage necessary to apply the current I1 to the transistor MN4 (or MN5) in an ON-state. It is assumed that the transistor MN8 performs the pentode operation by a gate voltage BIAS2.

The n-type transistor MN4 (or MN5) performs the pentode operation with a voltage represented by the Expression (5) set as the lower limit. Therefore, a requirement that the transistors MN4, MN5, MN8, and MP4 to MP7 perform the pentode operation is that the voltages VA and VB are equal to or higher than the voltage represented by the Expression (5).

For example, when the Vthn2 is 0.3 V and the Vovn8 and Vovn4 are 0.2 V, the voltage represented by the Expression (5) is 0.7 V. That is, when the voltages VA and VB are equal to or higher than 0.7 V, the differential amplifier AMP1 can operate normally as the analog circuit.

In this case, for example, when the voltages VA and VB are about 0.8 V at the low temperature of −40 degree as described above, the differential amplifier AMP1 operates normally. However, when the voltages VA and VB are about 0.5 V at the high temperature of 125 degrees as described above, the differential amplifier AMP1 does not operate normally. That is, when the n-type transistors MN4 and MN5 having the relatively high threshold voltage Vthn2 are used, then a lower limit of the pentode operation range of the differential amplifier AMP1 is increased, and the differential amplifier AMP1 does not operate normally at a time of a high temperature or the like. The lower limit of the voltages VA and VB of the differential amplifier AMP1 is also increased when the Vovn8, the Vovn4, and the Vthn2 are high in the Expression (5) besides at the time of a high temperature. In such a case, some of the transistors of the differential amplifier AMP1 perform the triode operation, resulting in insufficient gain.

From the above configurations, the differential amplifier AMP1 has flexibility at a low temperature or the like but possibly does not operate normally at a high temperature or the like. Considering the possible problem, the differential amplifier AMP2 is provided to compensate for the operation performed by the differential amplifier AMP1. Because the voltages VA and VB are low at a high temperature, transistors having the lower threshold voltage than that of the transistors MN4 and MN5 are used as the n-type transistors MN6 and MN7 of the differential amplifier AMP2.

(Compensation of Pentode Operation Ranges of AMP1 and AMP2)

The differential amplifiers AMP1 and AMP2 share the nodes N10 and N11 (PPG2). The current mirror part constituted by the n-type transistors MN10 and MN11 applies the identical mirrored currents to the nodes N10 and N11. At this time, a sum of the current applied from the differential amplifier AMP1 via the transistors MP6 and MP7 and the current applied from the differential amplifier AMP2 via the transistors MP10 and MP11 is applied to the nodes N10 and N11.

The voltages VA and VB are common to the differential amplifiers AMP1 and AMP2. Therefore, as long as one of the differential amplifiers AMP1 and AMP2 normally performs the pentode operation, the voltages VA and VB can be normally kept to the identical voltage even if the other starts the triode operation. Therefore, it can be said that a sum (AND) of the pentode operation range of the differential amplifier AMP1 and that of the differential amplifier AMP2 is a pentode operation range of the entire BGR circuit 400.

Figure 9:
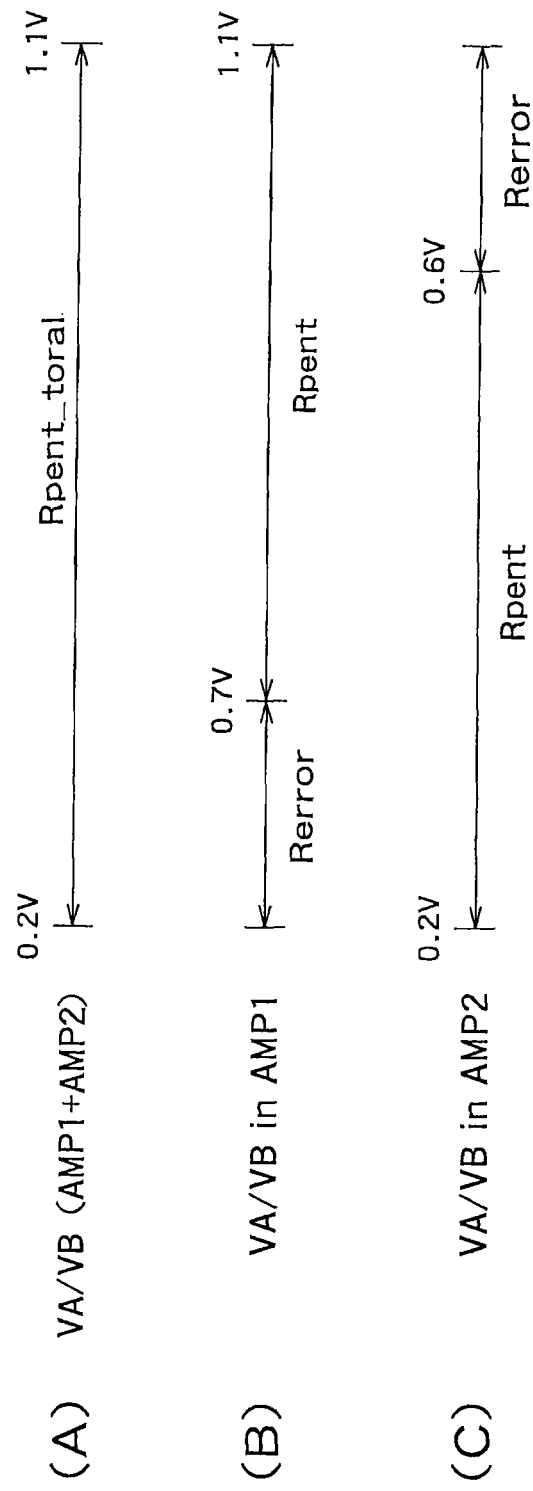
FIGS. 9A to 9C show pentode operation ranges of the differential amplifiers AMP1 and AMP2 and the BGR circuit 400, respectively.

FIGS. 9A to 9C show pentode operation ranges of the differential amplifiers AMP1 and AMP2 and the BGR circuit 400, respectively. FIG. 9A shows a pentode operation range of the entire BGR circuit 400. FIG. 9B shows a pentode operation range of the differential amplifier AMP1. FIG. 9C shows a pentode operation range of the differential amplifier AMP2. In FIGS. 9A to 9C, Rpent indicates the pentode operation range and Rerror indicates a triode operation range other than the pentode operation range.

With reference to FIGS. 9B and 9C, the pentode operation ranges Rpent differ and shift in the differential amplifiers AMP1 and AMP2. For example, in specific examples shown in FIGS. 9B and 9C, the pentode operation range Rpent of the differential amplifier AMP1 is 0.7 V to 1.1 V whereas the pentode operation range Rpent of the differential amplifier AMP2 is 0.2 V to 0.6 V. Accordingly, as shown in FIG. 9A, the pentode operation range Rpent (Rpent_total) of the BGR circuit 400 is 0.2 V to 1.1 V.

In this way, in the BGR circuit 400 according to the third embodiment, the differential amplifiers AMP1 and AMP2 have the pentode operation ranges different from each other and compensate for each other. Therefore, the BGR circuit 400 can secure the wide pentode operation range Rpent_total as a whole. As a result, the BGR circuit 400 operates normally even at a low temperature, a high temperature, the low VCC or the like and can generate the stable reference voltage Vref.

It can be considered to change the pentode operation ranges of the differential amplifiers AMP1 and AMP2 by adjusting the threshold voltage Vthp1 of the p-type transistors MP4 to MP11. However, in this case, it is necessary to form p-type transistors having different threshold voltages, which increases the number of manufacturing processes and increases the cost.

On the other hand, according to the third embodiment, the n-type transistors having the different threshold voltages Vthn1 and Vthn2 are formed in existing manufacturing processes. Accordingly, the BGR circuit 400 according to the third embodiment can be manufactured without increasing the number of manufacturing processes.

Fourth Embodiment

Figure 10:
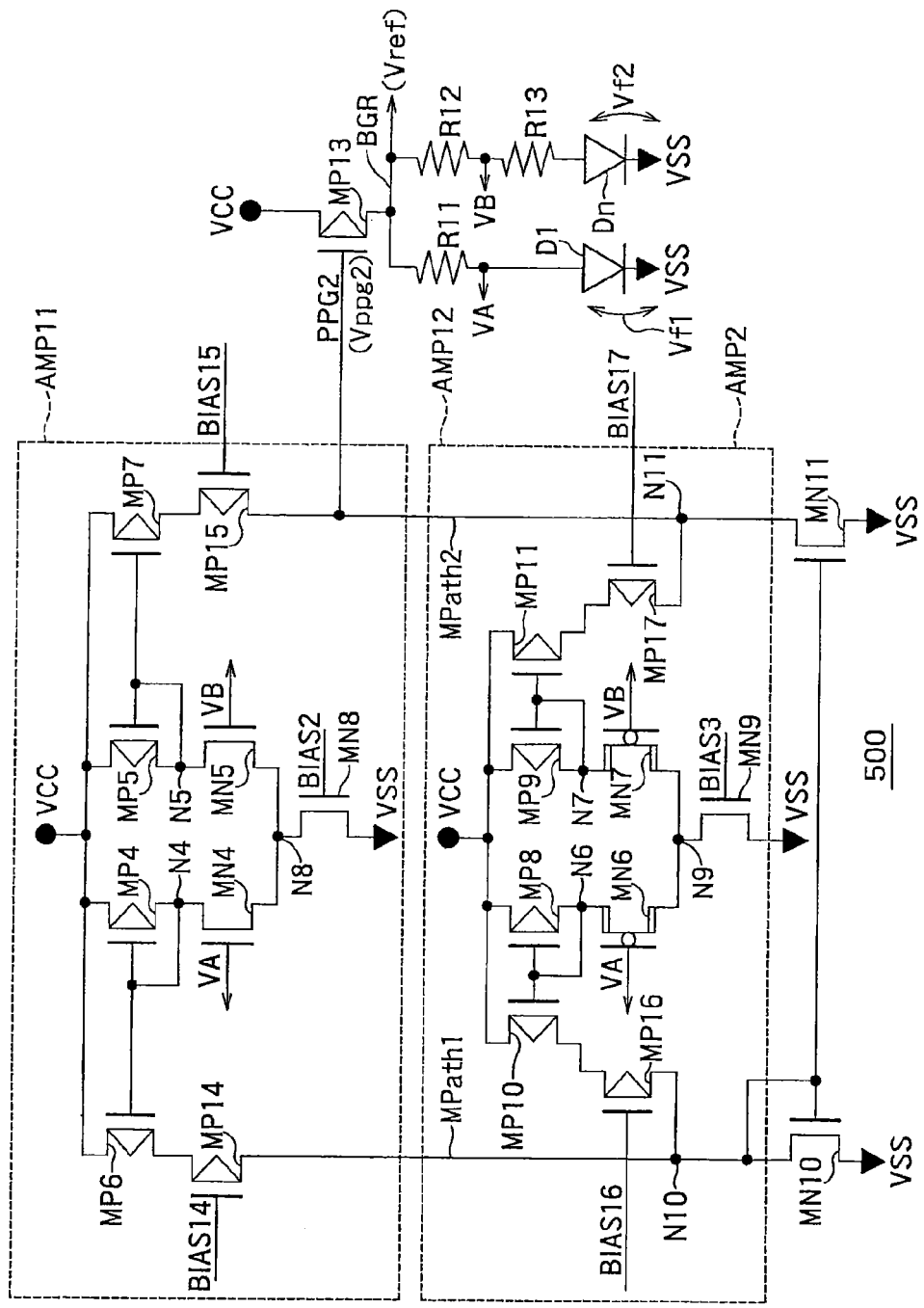
FIG. 10 is a circuit diagram showing an example of a BGR circuit 500 according to a fourth embodiment.

FIG. 10 is a circuit diagram showing an example of a BGR circuit 500 according to a fourth embodiment. The BGR circuit 500 includes a first differential amplifier AMP11 and a second differential amplifier AMP12. The resistors R11 to R13, the diodes D1 and Dn, and the voltage generation transistor MP13 of the BGR circuit 500 can be used as those of the BGR circuit 400

The first differential amplifier AMP11 further includes a p-type transistor MP14 connected between the n-type transistor MP6 and the node N10 and a p-type transistor MP15 connected between the p-type transistor MP7 and the node N11 (PPG2). Other configurations of the first differential amplifier AMP11 can be identical to those of the first differential amplifier AMP1.

The second differential amplifier AMP12 further includes a p-type transistor MP16 connected between the n-type transistor MP10 and the node N10 and a p-type transistor MP17 connected between the p-type transistor MP11 and the node N11 (PPG2). Other configurations of the second differential amplifier AMP12 can be identical to those of the first differential amplifier AMP2.

The transistors MP14 to MP17 have identical characteristics (for example, an identical threshold voltage). Gates of the transistors MP14 to MP17 receive gate voltages BIAS4 to BIAS7, respectively. The gate voltages BIAS4 to BIAS7 are voltages set so that the transistors MP14 to MP17 perform the pentode operation, respectively, and change in proportion to the VCC.

When the VCC rises, the Vppg2 similarly rises. Accordingly, when the transistors MP14 to MP17 are not provided as in the case of the BGR circuit 400 according to the third embodiment, source-drain voltages Vds of the transistors MP7 and MP11 are substantially constant. However, the source-drain voltages Vds of the transistors MP6 and MP10 are increased when the VCC rises. Therefore, accuracies of the current mirror part constituted by the transistors MP4 and MP6 and that constituted by the transistors MP8 and MP10 degrade. In this case, the Vref rises in proportion to the VCC.

On the other hand, the BGR circuit 500 according to the fourth embodiment includes the transistors MP14 to MP17, whereby it is possible to keep constant the source-drain voltages Vds of the transistors MP6, MP7, MP10, and MP11.

It is assumed here that threshold voltages of the transistors MP14 to MP17 are Vthp14 to Vthp17, respectively. It is also assumed here that overdrive voltages necessary to apply the current I1 to the transistors MP14 to MP17 in ON-states are Vovp14 to Vovp17, respectively. On this assumption, source voltages of the transistors MP14 to MP17 (drain voltages of the transistors MP6, MP7, MP10, and MP11) are BIAS14+Vthp14+Vovp14, BIAS15+Vthp15+Vovp15, BIAS16+Vthp16+Vovp16, and BIAS17+Vthp17+Vovp17, respectively. That is, by making the characteristics of the transistors MP14 to MP17 identical, the drain voltages of the transistors MP6, MP7, MP10, and MP11 change depending on the BIAS14 to BIAS17, respectively. The BIAS14 to BIAS17 are fixed to predetermined voltages, respectively. Therefore, the source-drain voltages Vds of the transistors MP6, MP7, MP10, and MP11 can be kept constant because the drain voltages of the transistors MP6, MP7, MP10, and MP11 change in proportion to the VCC. The BGR circuit 500 can thereby keep high the accuracies of the current mirror part constituted by the transistors MP4 and MP6, that constituted by the transistors MP5 and MP7, that constituted by the transistors MP8 and MP10, and that constituted by the transistors MP9 and MP11. As a result, the reference voltage Vref can be kept substantially constant irrespectively of the VCC. The fourth embodiment can also obtain effects of the third embodiment.

In the embodiments described above, the differential amplifiers configured so that the n-type transistors receive the feedback are used. Alternatively, differential amplifiers configured so that p-type transistors receive the feedback can be used in the above embodiments. Also in this case, the embodiments described above can be carried out in the same manner, and effects identical to those of the embodiments described above can be also obtained.

In above embodiments, the words of "connect" and "electrically connect" include mean of at least one of "electrically connect", "electrically connect via a current path of a transistor", "physically connect", and "directly connect".

A semiconductor device according to the third and fourth embodiments comprising:
an input part configured to receive a first power supply voltage;
an output part configured to output a second power supply voltage;
a voltage generation transistor connected between the input part and the output part, and configured to generate the second power supply voltage from the first power supply voltage;
a first current path electrically connected to a gate of the voltage generation transistor;
a current mirror part connected to the first current path and a second current path; and
a first differential amplifier and a second differential amplifier sharing the first current path and the second current path, and electrically connected commonly to voltages (VA, VB) according to the second power supply voltage.

The first differential amplifier comprises first and second transistors electrically connected to the voltages (VA, VB) according to the second power supply voltage, and have an identical first threshold voltage,
the second differential amplifier comprises third and fourth transistors electrically connected to the voltages (VA, VB) according to the second power supply voltage, and have an identical second threshold voltage, and
the first threshold voltage is higher than the second threshold voltage.

A range of the second power supply voltage when the first differential amplifier performs a pentode operation differs from a range of the second power supply voltage when the second differential amplifier performs the pentode operation.

The semiconductor device according to the fourth embodiment further comprising:
a fifth transistor (MP15) connected to a first current path between the first power supply voltage and the current mirror part;
a sixth transistor (MP14) connected to a second current path between the first power supply voltage and the current mirror part;
a seventh transistor (MP17) connected between the second differential amplifier and the first current path; and
an eighth transistor (MP16) connected between the second differential amplifier and the second current path.

Gate voltages of the fifth to eighth transistors are fixed to predetermined voltages, respectively.

A memory cell array formation may be disclosed in U.S. patent application Ser. No. 12/407,403 filed on Mar. 19, 2009. U.S. patent application Ser. No. 12/407,403, the entire contents of which are incorporated by reference herein.

Furthermore, a memory cell array formation may be disclosed in U.S. patent application Ser. No. 12/406,524 filed on Mar. 18, 2009. U.S. patent application Ser. No. 12/406,524, the entire contents of which are incorporated by reference herein.

Furthermore, a memory cell array formation may be disclosed in U.S. patent application Ser. No. 12/679,991 filed on Mar. 25, 2010. U.S. patent application Ser. No. 12/679,991, the entire contents of which are incorporated by reference herein.

Furthermore, a memory cell array formation may be disclosed in U.S. patent application Ser. No. 12/532,030 filed on Mar. 23, 2009. U.S. patent application Ser. No. 12/532,030, the entire contents of which are incorporated by reference herein.

In the first to third embodiments, it is defined that a page unit is the range of a plurality of memory cells along one word line, and that a block unit is the range of a plurality of NAND cell units aligned in the word line direction. However, the present invention is not limited to these definitions. For example, in a case where a plurality of sub-blocks are present in one block and a plurality of so-called strings constitute each sub-block, then a plurality of memory cells included in a certain sub-block can be defined as a page, and the sub-blocks can be defined as an erasure unit.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:
1. A semiconductor device comprising:
an input part configured to receive a first voltage;
an output part configured to output a second voltage;
a current mirror part configured to receive the first voltage;
a reference transistor electrically connected between the current mirror part and a ground voltage, a reference voltage being applied to a gate of the reference transistor;
a monitor transistor including a gate electrically connected to the output part and being electrically connected between the current mirror part and the ground voltage;
a voltage generation transistor including a gate electrically connected to both the current mirror part and the reference transistor, the voltage generation transistor being electrically connected between the input part and the output part;
a first capacitor including one end electrically connected to the output part, and the other end electrically connected to both the current mirror part and the reference transistor;
a first transistor electrically connected between a first node and a second node, the first node being between the current mirror part and the reference transistor, the second node being between the current mirror part and the reference transistor; and a second transistor electrically connected between the current mirror part and the monitor transistor.

2. The device of claim 1, wherein the first and second transistors are depletion type transistors and gates of the first and second transistors are electrically connected to a ground voltage.

3. The device of claim 1, wherein the first transistor is configured to keep a voltage of the second node to be equal to or lower than a voltage applied to a gate of the first transistor minus a threshold voltage of the first transistor, when the gate voltage of the first transistor is set as a basis of voltage.

4. The device of claim 1, wherein
the first voltage is an external power supply voltage supplied from outside of the semiconductor device, and
the second voltage is an internal power supply voltage obtained by boosting or dropping the first voltage.

5. The device of claim 1, further comprising a constant-current source, and wherein the current mirror part, the reference transistor, the monitor transistor, and the constant-current source form a differential amplifier.

6. A semiconductor device comprising:
an input part configured to receive a first voltage;
an output part configured to output a second voltage;
a current mirror part configured to receive the first voltage;
a reference transistor electrically connected between the current mirror part and a ground voltage, a reference voltage being applied to a gate of the reference transistor;
a monitor transistor including a gate electrically connected to the output part and being electrically connected between the current mirror part and the ground voltage;
a first voltage generation transistor including a gate electrically connected to both the current mirror part and the reference transistor, the voltage generation transistor being electrically connected between the input part and the output part;

a delay resistor having one end electrically connected to the output part;
a second voltage generation transistor including a gate electrically connected to both the current mirror part and the reference transistor and being electrically connected to both the input part and the other end of the delay resistor;
a first transistor electrically connected between a first node and a second node, the first node being between the current mirror part and the reference transistor, the second node being between the current mirror part and the reference transistor; and
a second transistor electrically connected between the current mirror part and the monitor transistor.

7. The device of claim 6, wherein threshold voltages of the first voltage generation transistor and the second voltage generation transistor are substantially identical to each other.

8. The device of claim 6, wherein
the first voltage is an external power supply voltage supplied from outside of the semiconductor device, and
the second voltage is an internal power supply voltage obtained by boosting or dropping the external power supply voltage.

9. The device of claim 6, wherein the current mirror part, the reference transistor, the monitor transistor, and the ground voltage form a differential amplifier.

10. The device of claim 6, further comprising a first capacitor having one end electrically connected to the output part, and having other end electrically connected to both the current mirror part and the reference transistor.

11. The device of claim 6, wherein the first and second transistors are depletion type transistors and gates of the first and second transistors are electrically connected to a ground voltage.

12. The device of claim 6, wherein the first transistor is configured to keep a voltage of the second node to be equal to or lower than a voltage applied to a gate of the first transistor minus a threshold voltage of the first transistor, when the gate voltage of the first transistor is set as a basis of voltage.

* * * * *